(12) United States Patent
Wu et al.

(10) Patent No.: US 9,513,523 B2
(45) Date of Patent: Dec. 6, 2016

(54) THIN FILM TRANSISTOR ARRAY SUBSTRATE AND METHOD OF FABRICATING SAME

(71) Applicant: Ye Xin Technology Consulting Co., Ltd., Hsinchu (TW)

(72) Inventors: Mei-Ling Wu, New Taipei (TW);
Chih-Yuan Hou, New Taipei (TW);
Hsin-An Cheng, New Taipei (TW);
Yang-Chu Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/812,151

(22) Filed: Jul. 29, 2015

(65) Prior Publication Data

US 2016/0187689 A1 Jun. 30, 2016

(30) Foreign Application Priority Data

Dec. 31, 2014 (TW) .............................. 103146677 A

(51) Int. Cl.
*H01L 27/12* (2006.01)
*G02F 1/1368* (2006.01)
*H01L 29/786* (2006.01)
*G02F 1/1362* (2006.01)

(52) U.S. Cl.
CPC ......... *G02F 1/1368* (2013.01); *H01L 27/1214* (2013.01); *H01L 27/1259* (2013.01); *H01L 29/78672* (2013.01); *G02F 2001/136222* (2013.01)

(58) Field of Classification Search
CPC ................... G02F 1/1368; G02F 2001/136222; H01L 27/1214; H01L 27/1259; H01L 29/78672
See application file for complete search history.

(56) References Cited

U.S. PATENT DOCUMENTS

| 7,893,607 B2* | 2/2011 | Terakado | H01L 27/322 313/483 |
| 2004/0023425 A1* | 2/2004 | Chen | G02F 1/136227 438/27 |
| 2006/0093928 A1* | 5/2006 | Hung | G02F 1/133516 430/7 |
| 2007/0247572 A1* | 10/2007 | Hung | G02F 1/133555 349/114 |
| 2014/0104527 A1* | 4/2014 | Yang | H01L 27/1225 349/43 |

* cited by examiner

*Primary Examiner* — Fernando L Toledo
*Assistant Examiner* — Neil Prasad
(74) *Attorney, Agent, or Firm* — Zhigang Ma

(57) ABSTRACT

A thin film transistor (TFT) array substrate includes a first substrate, a plurality of TFTs formed on the first substrate, a color filter layer covered on the TFTs, and a plurality of pixel electrodes corresponding to the TFTs. The color filter layer is directly formed on the TFTs. The color filter layer includes a plurality of photoresist units. Each of the pixel electrodes is to electrically connected to a drain of the TFT via an opening.

16 Claims, 12 Drawing Sheets

THIN FILM TRANSISTOR ARRAY SUBSTRATE AND METHOD OF FABRICATING SAME

CROSS-REFERENCE TO RELATED APPLICATIONS

This application claims priority to Taiwanese Patent Application No. 103146677 filed on Dec. 31, 2014, the contents of which are incorporated by reference herein.

FIELD

The subject matter herein generally relates to a thin transistor array substrate, and a method of fabricating a thin film transistor array substrate.

BACKGROUND

Liquid crystal display (LCD) includes a thin film transistor array substrate and a color filter substrate which are separately formed. An error of alignment can occur between the thin film transistor array substrate and the color filter substrate while assembling.

BRIEF DESCRIPTION OF THE FIGURES

Implementations of the present technology will now be described, by way of example only, with reference to the attached figures.

DETAILED DESCRIPTION

Figure 1:
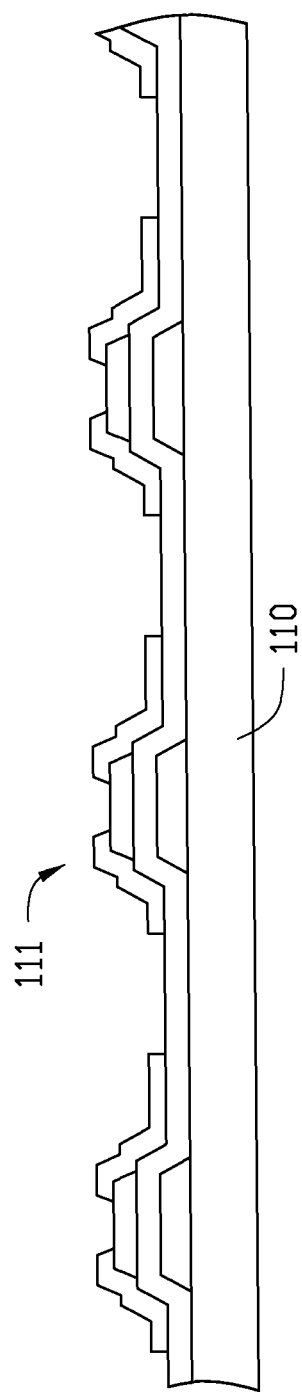
FIG. 1 is a cross-sectional view of an embodiment of a first substrate with thin film transistors (TFTs).
Figure 2:
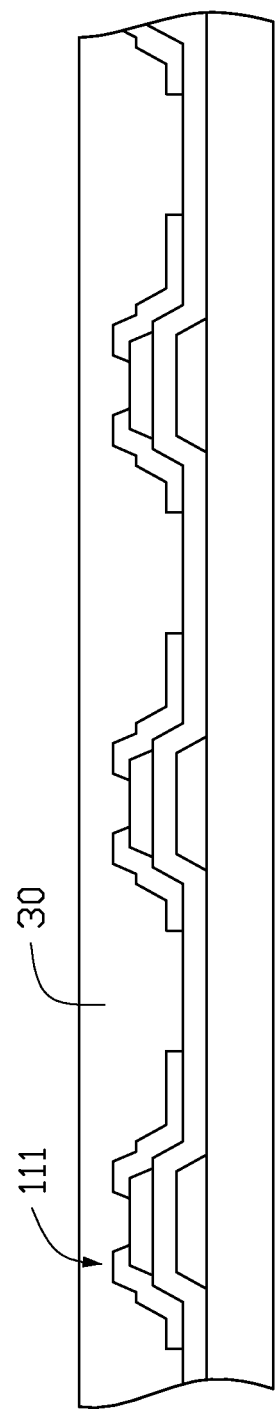
FIG. 2 is a cross-sectional view of an embodiment of a photoresist layer covering on the TFTs of FIG. 1.
Figure 3:
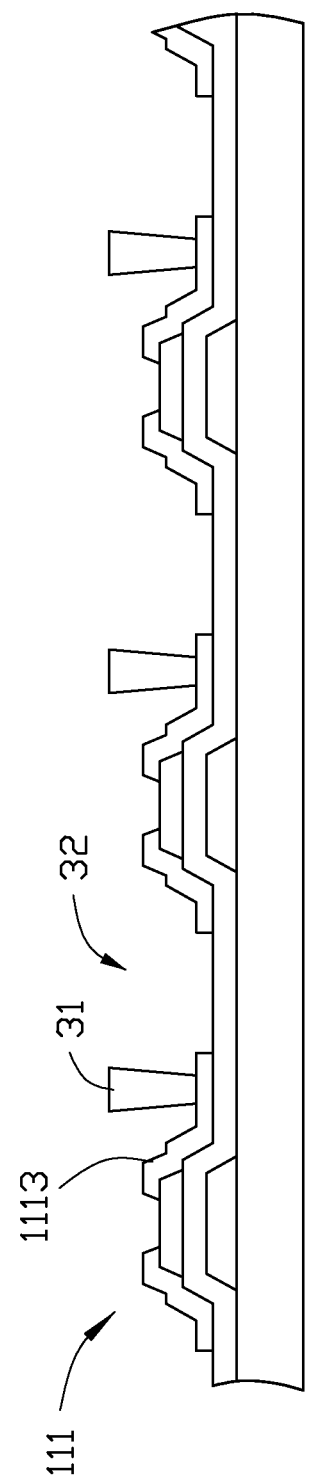
FIG. 3 is a cross-sectional view of an embodiment of a plurality of spacers and a plurality of gaps formed via patterning the photoresist layer of FIG. 3.
Figure 4:
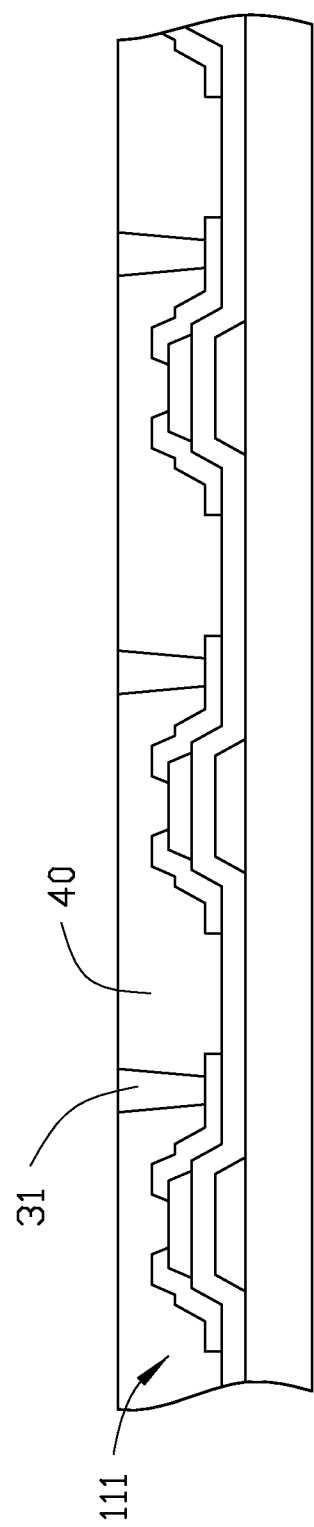
FIG. 4 is a cross-sectional view of an embodiment of a red photoresist layer filling the gaps of FIG. 3.
Figure 5:
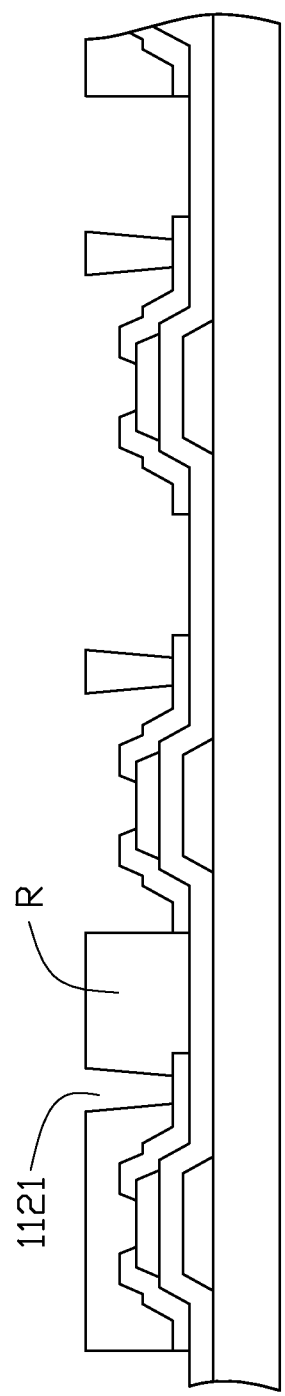
FIG. 5 is a cross-sectional view of an embodiment of red photoresist units formed via patterning the red photoresist layer of FIG. 4.
Figure 6:
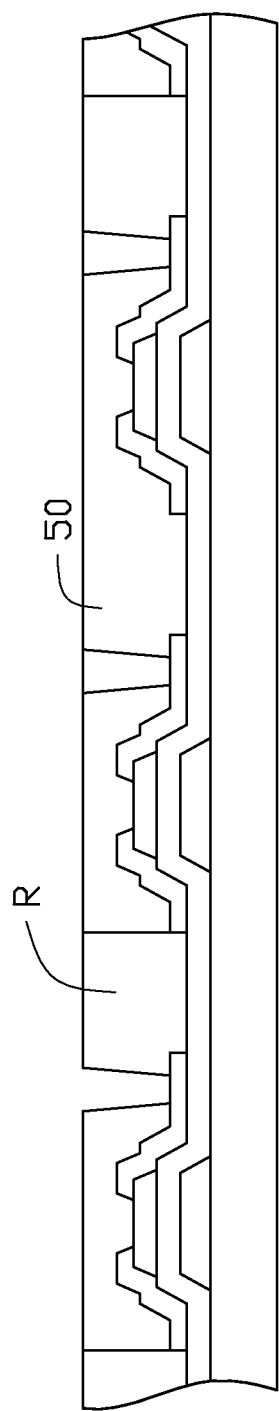
FIG. 6 is a cross-sectional view of an embodiment of a green photoresist layer filling the rest gaps of FIG. 5.
Figure 7:
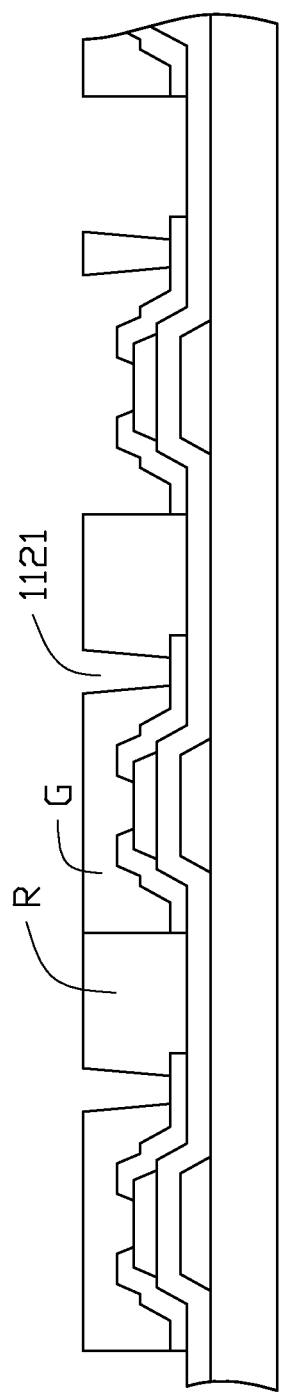
FIG. 7 is a cross-sectional view of an embodiment of green photoresist units formed via patterning the green photoresist layer of FIG. 6.
Figure 8:
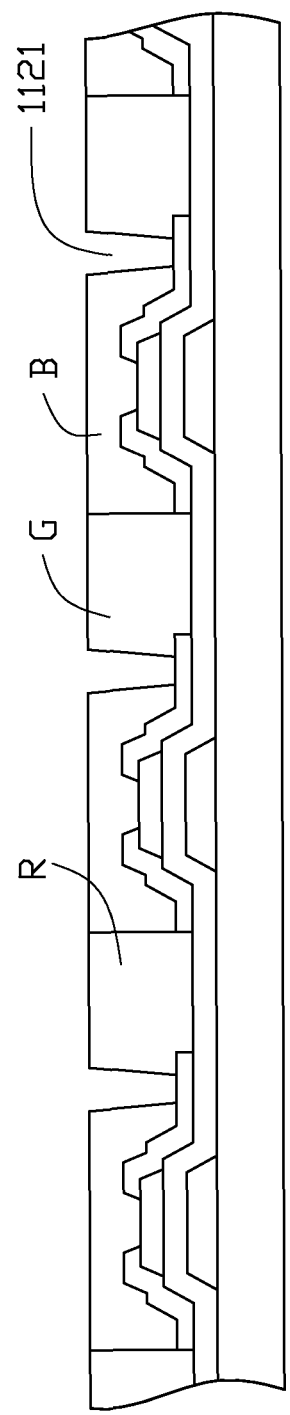
FIG. 8 is a cross-sectional view of an embodiment of a blue photoresist layer covered the remainder of gaps of FIG. 7.
Figure 9:
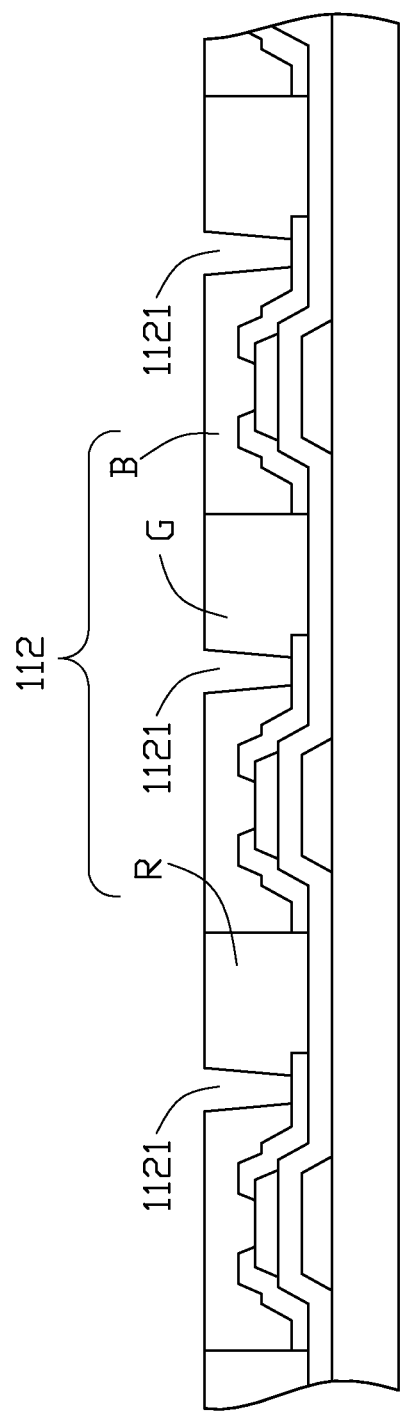
FIG. 9 is a cross-sectional view of an embodiment of a color filter layer formed by the red, the green, and the blue photoresist units of FIG. 8.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a thin film transistor (TFT) array substrate 11 that can be easily assembled.

FIGS. 1-9 illustrate an embodiment of a TFT array substrate 11 during fabrication. The TFT array substrate 11 includes a first substrate 110 and a plurality of TFTs 111 formed on the first substrate 110. The TFTs 111 are spaced a first predetermined distance from each other.

The TFT array substrate 11 further includes a photoresist layer 30 covering the first substrate 110 and the TFTs 111. The photoresist layer 30 is cut to form a plurality of spacers 31. The spacers 31 are spaced a second predetermined distance from each other to form a plurality of gaps 32. The spacer 31 is located on an upper surface of a drain 1113 of a TFT 111. The spacer 31 is substantially a trapezoidal shape. In at least one embodiment, the photoresist layer 30 is a positive photoresist. The opening 1121 is substantially a trapezoidal shape. A width of the opening away from the first substrate 110 is wider than a width of the opening adjacent to the first substrate 110. A width of the spacer 31 is in a range between 3-5 micrometer (mm) A height of the spacer 31 is in a range between 5-10 mm.

The TFT array substrate 11 further includes a red photoresist layer 40 filling in the gap 32. The red photoresist layer 40 is substantially coplanar with the TFT 111. The red photoresist layer 30 is exposed and developed to form a plurality of red photoresist units R. The red photoresist units R are spaced a third distance from each other. Each of the red photoresist units R corresponds to an opening 1121. The opening 1121 is formed by removing the spacer 31 disposed in a red photoresist unit R while exposing and developing the red photoresist layer 30. In at least one embodiment, the red photoresist layer 40 is a negative photoresist. Each of the adjacent red photoresist units R contains two TFTs 111.

The TFT array substrate 11 further includes a green photoresist layer 50 filling in the gaps 32 which are not filled with the red photoresist units R. The green photoresist layer 50 is substantially coplanar with the red photoresist units R. The green photoresist layer 50 is exposed and developed to form a plurality of green photoresist units G. The green photoresist units G are spaced the third distance from each other. Each of the green photoresist units G corresponds to an opening 1121. The opening 1121 is formed by removing the spacer 31 disposed in the corresponding green photoresist unit G while exposing and developing the green photoresist layer 40. In at least one embodiment, the green photoresist layer 50 is a negative photoresist. Each of the green photoresist units G is adjacent to a red photoresist unit R.

The TFT array substrate 11 further includes blue photoresist units B formed by filling blue photoresist in the gaps 32 which are not filled with the red photoresist units R or the green photoresist units G. The spacer 31 disposed in a blue photoresist unit B is removed to form an openings 1121 via an exposing and developing manner. Each of the blue photoresist units G is adjacent to a green photoresist unit G. The red photoresist units R, the green photoresist units G, and the blue photoresist units B are alternately disposed in the gaps 32, and cooperate with each other to from a color filter layer 112. The color filter layer 112 is also used as a deactivation layer of the TFT 111. In other embodiments, the TFT array substrate 11 further includes a plurality of white photoresist units W. The red photoresist units R, the green photoresist units G, the blue photoresist units B, and the white photoresist units W are orderly and alternately disposed in the gaps 32, and cooperate with each other to from a color filter layer 112.

Figure 10:
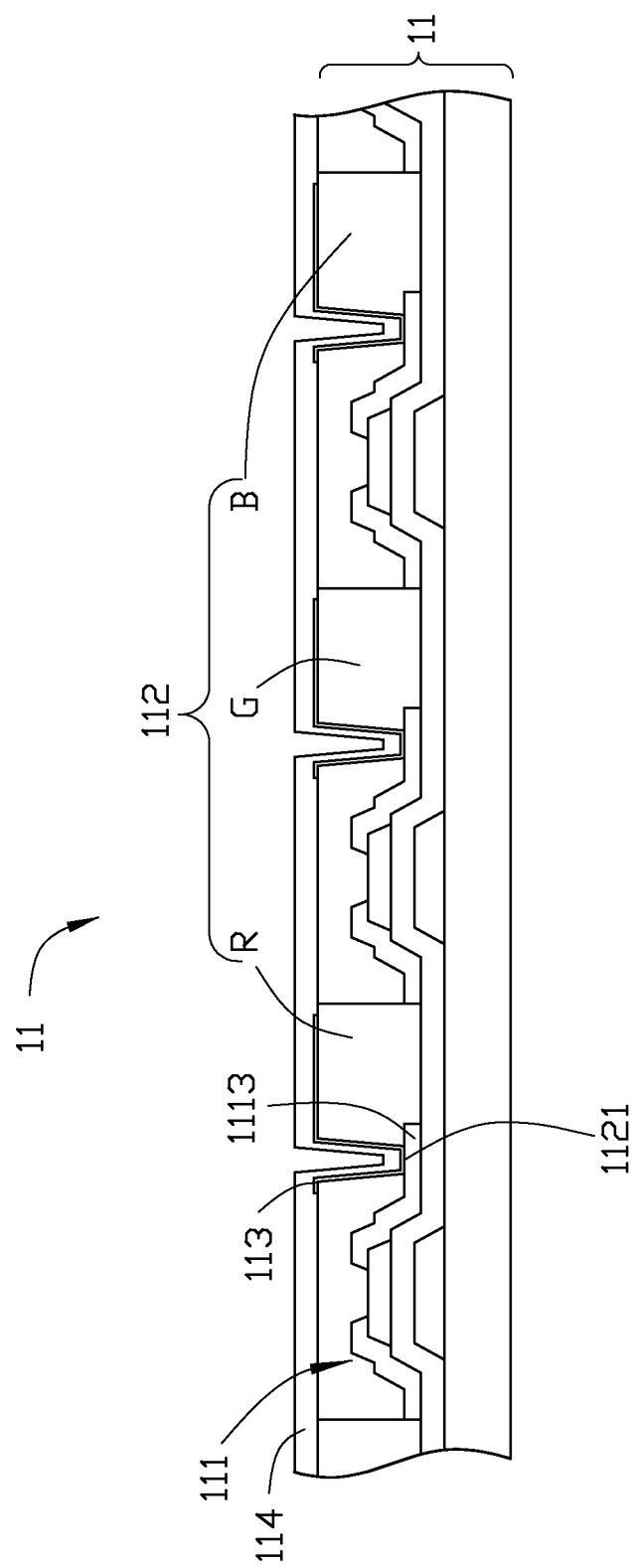
FIG. 10 is a cross-sectional view of an embodiment of a display panel of FIG. 1.

FIG. 10 illustrates an embodiment of the TFT array substrate 11. The TFT array substrate 11 further includes a plurality of pixel electrodes 113 and an insulating layer 114 formed on the color filter layer 112. The pixel electrode 113 is electrically connected with a drain of the TFT 111 via the openings 1121. The pixel electrode layer 113 is sandwiched between the insulating layer 114 and the color filter layer 112. The insulating layer 114 simultaneously covers the color filter layer 112 and the pixel electrodes 113. In at least one embodiment, the insulating layer 114 is made of silsesquioxane or siloxanes material. A thickness of the insulating layer 114 is in a range between 0.5-2.0 mm.

The color filter 112 is directly formed on TFT array substrate 11. When fabricating the TFT array substrate 11, the spacers 31 in a positive photoresist are formed on the TFT 111, and are removed after forming the color filter 112 in a negative photoresist. Therefore, a size of the opening 1121 and the thickness of the TFT array substrate 11 can be decreased.

Figure 11:
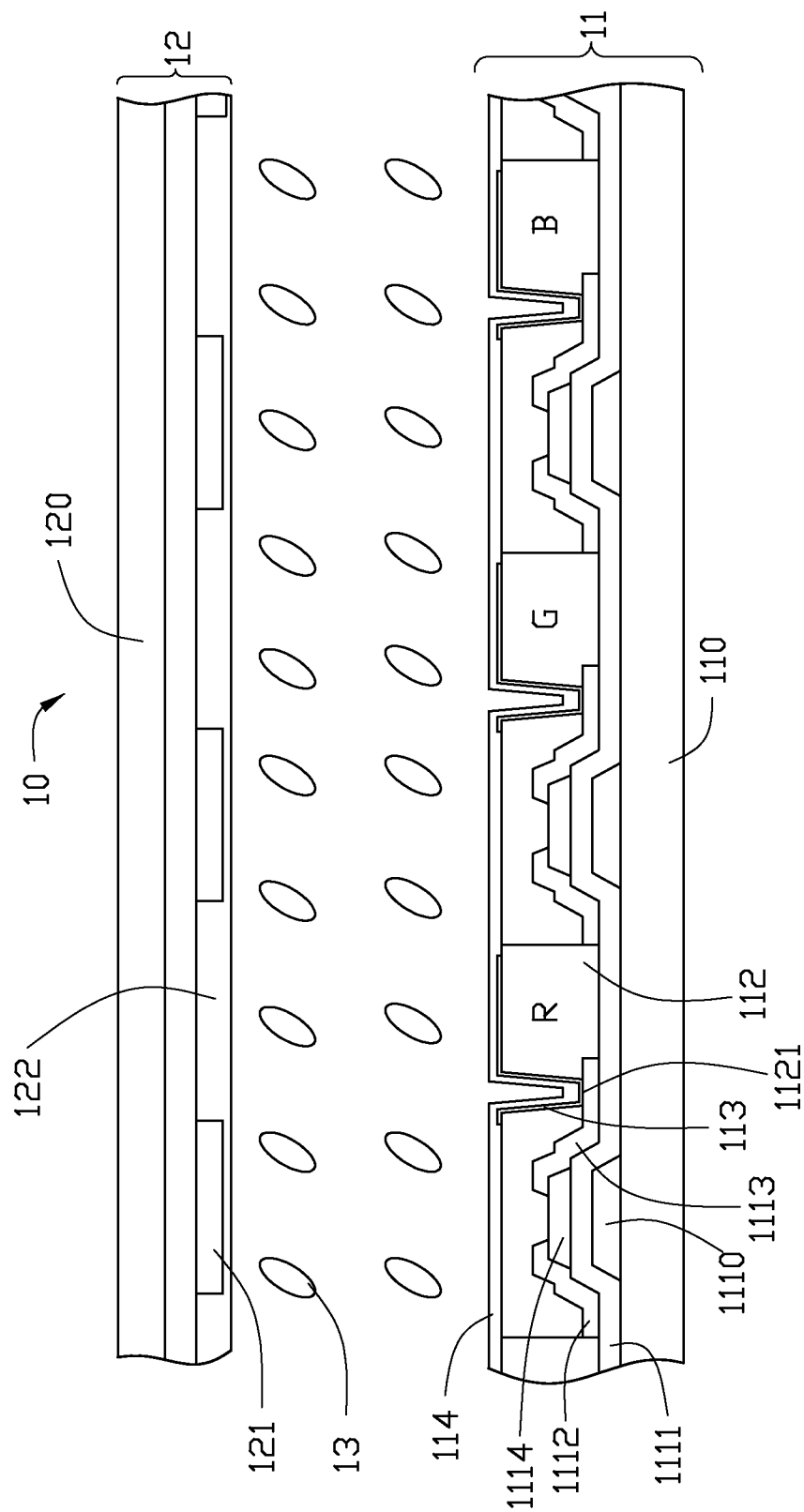
FIG. 11 is a cross-sectional view of a first embodiment of a display panel.

FIG. 11 illustrates a first embodiment of a display panel 10. The display panel 10 includes a TFT array substrate 11, and an opposite substrate 12, and a liquid crystal layer 23 sandwiched between the TFT array substrate 11 and the opposite substrate 12.

The TFT array substrate 11 includes a first substrate 110, a plurality of TFTs 111, a color filter layer 112, a plurality of pixel electrodes 113, and an insulating layer 114. The first substrate 110 is made of transparent material, such as glass or quartz, or is made of inorganic, such as chip or ceramics, or is made of flexible organics, such as plastic, rubber, polyester, or polycarbonate.

The TFT 111 is located on the first substrate 110. The TFT 111 includes a gate 1110, a gate insulating layer 1111, a source 1112, and a drain 1113, and a path layer 1114. The gate 1110 is located on the first substrate 110. The gate insulating layer 1111 covers the gate 1110 and the first substrate 110. The path layer 1114 is located above the gate insulating layer 1111 and corresponds to the gate 1110. The source 1112 and the drain 1113 are symmetrically opposite on the gate insulating layer 1111 and the path layer 1114. In at least one embodiment, the TFT 111 is a low temperature poly-silicon thin film transistor.

The color filter layer 112 covers the TFT 111. The color filter layer 114 is considered as a deactivation layer of the TFT 111. The color filter layer 112 includes a plurality of red photoresist units R, a plurality of green photoresist units G, and a plurality of blue photoresist units B. The red photoresist units R, the green photoresist units G, and the blue photoresist units B are alternately disposed on the TFT array substrate 11. Each of the red photoresist units R, the green photoresist units G, and the blue photoresist units B defines an opening 1121. A drain of the TFT 111 is exposed via the opening 1121. A width of the opening 1121 is in a range between 3-5 micrometer (mm) A height of the spacer 31 is in a range between 5-10 mm. In at least one embodiment, the opening 1121 is substantially a trapezoidal shape. A width of the opening 1121 away from the first substrate 110 is wider than a width of the opening 1121 adjacent to the first substrate 110. The width of the opening 1121 from the first substrate 110 is 5 mm, and a width of the opening 1121 adjacent to the first substrate 110 is 3 mm.

The pixel electrode 113 is located on an upper surface of the color layer 112, and is electrically connected to the TFT 111. In at least one embodiment, the pixel electrode 113 is a made of transparent material, such as indium tin oxide. In at least one embodiment, the pixel electrode 113 is capable of driving the liquid crystal layer 13 to rotate.

The insulating layer 114 simultaneously covers the color filter layer 112 and the pixel electrodes 113. In at least one embodiment, the insulating layer 114 is made of made of silsesquioxane or siloxanes. silsesquioxane or siloxanes. A thickness of the insulating layer 114 is in a range between 0.5-2.0 mm.

The opposite substrate 12 includes a second substrate 120, a black matrix 121, a flat layer 122, and a common electrode layer 123. The black matrix 121 cooperates with the color filter 112 to form a color filter of the display panel 10. The black matrix 121 is located on a surface of the second substrate 120 adjacent to the liquid crystal layer 13. The flat layer 122 is located on a surface of the black matrix 121 away from the second substrate 120. The common electrode layer 123 is sandwiched between the second substrate 120 and the black matrix 121. In at least one embodiment, the common electrode layer 123 cooperates with the pixel electrode 113 to drive the liquid crystal layer 130 to rotate. A material of the second substrate 120 is the same as the material of the first substrate 110. The common electrode layer 123 is made of transparent material, such as indium tin oxide. In other embodiments, the material of the second substrate 120 is different from the material of the first substrate 110.

Figure 12:
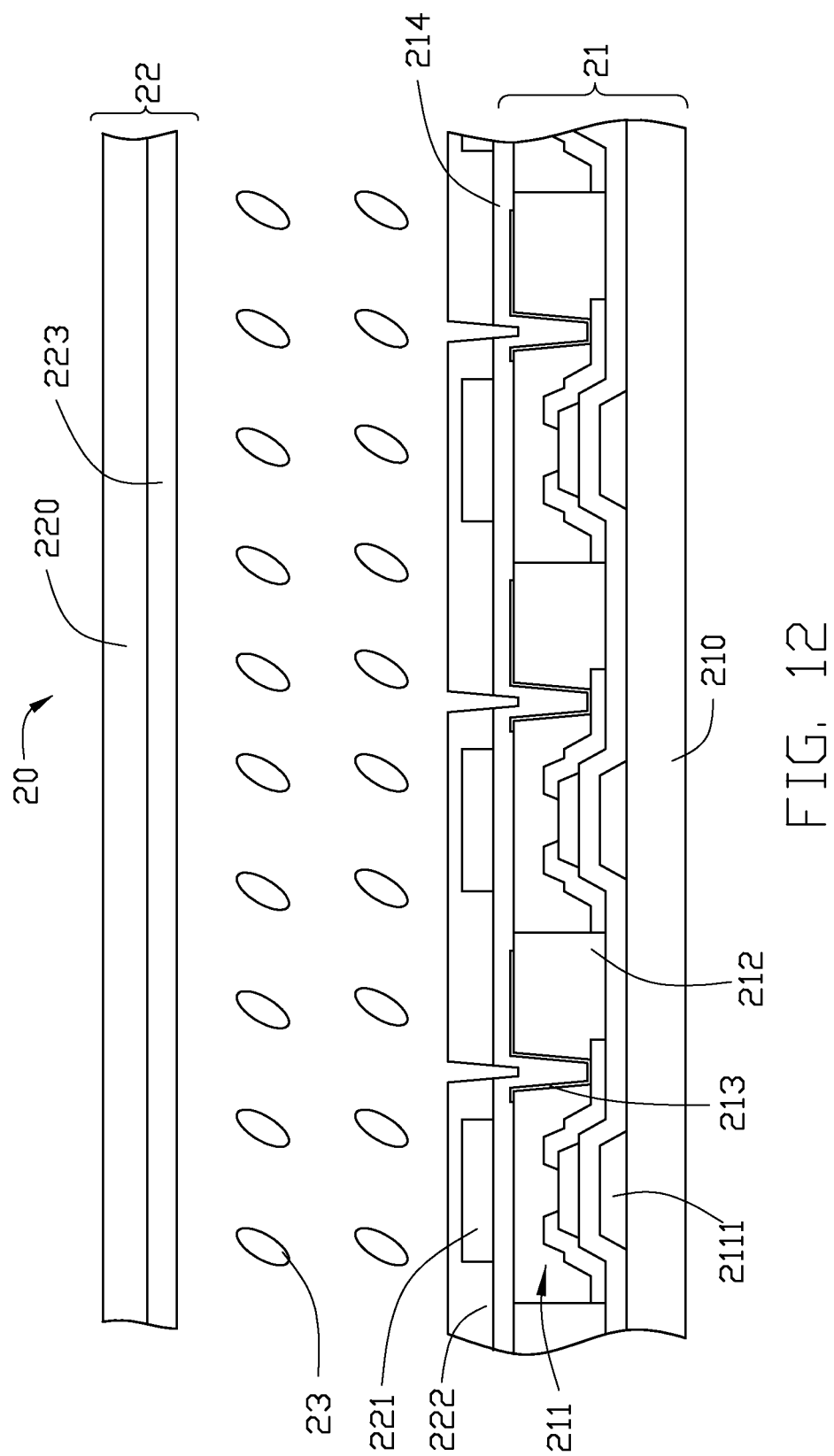
FIG. 12 is a cross-sectional view of a second embodiment of a display panel.

FIG. 12 illustrates a second embodiment of the display panel 20. The display panel 20 includes a TFT array substrate 21, and an opposite substrate 22, and a liquid crystal layer 23 sandwiched between the TFT array substrate 21 and the opposite substrate 22.

The TFT array substrate 21 includes a first substrate 210, a plurality of TFTs 211, a color filter layer 212, a plurality of pixel electrodes 213, and an insulating layer 214. The first substrate 210 is made of transparent material, such as glass or quartz, or is made of inorganic material, such as silicon chip or ceramics, or is made of flexible organic material, such as plastic, rubber, polyester, or polycarbonate.

The TFT 211 is located on the first substrate 210. In at least one embodiment, the TFT 211 is a low temperature poly-silicon thin film transistor.

The color filter layer 212 covers the TFT 211. The color filter layer 214 is considered as a deactivation layer of the TFT 211. The pixel electrode 213 is located on an upper surface of the color layer 212, and is electrically connected to the TFT 211. In at least one embodiment, the pixel electrode 213 is made of transparent material, such as indium tin oxide. In at least one embodiment, the pixel electrode 213 is capable of driving the liquid crystal layer 23 to rotate.

The insulating layer 214 simultaneously covers the color filter layer 212 and the pixel electrodes 213. In at least one embodiment, the insulating layer 214 is made of made of silsesquioxane or siloxanes. A thickness of the insulating layer 114 is in a range between 0.5-2.0 mm.

The display panel 20 further includes a black matrix 221 and a flat layer 222. The black matrix 221 is located on the insulating layer 214, and is opposite to a top surface of the TFT 211. The black matrix 221 cooperates with the color filter layer 212 to form a color filter of the display panel 20. The flat layer 222 covers the black matrix 221 and the insulating layer 214.

The opposite substrate 22 includes a second substrate 220 and a common electrode layer 223. The common electrode layer 223 is located on a surface of the second substrate 220 adjacent to the liquid crystal layer 23. In at least one embodiment, the common electrode layer 223 cooperates with the pixel electrode 213 to drive the liquid crystal layer 130 to rotate. A material of the second substrate 220 is equal to a material of the first substrate 210. The common electrode layer 223 is made of transparent material, such as indium tin oxide. In other embodiments, the material of the second substrate 220 is different from the material of the first substrate 210.

The color filter layer is directly formed on TFT array substrate, and the opening are defined on the TFT via a positive photoresist and a negative photoresist. Therefore, a thickness of the display panel is reduced and the fabricating process for fabricating the display panel is simplified.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A method for fabricating a thin film transistor (TFT) array substrate, the method comprising:
    forming a plurality of TFTs on a first substrate;
    forming a photoresist layer on the TFTs;
    patterning the photoresist layer by an exposing and developing manner to form a plurality of spacers corresponding to the TFTs and to define a plurality of gaps disposed between two adjacent spacers, each of which is located on a drain of the corresponding TFT;
    forming a color filter layer covered on the TFTs, the color filter layer comprising a plurality of color filter units corresponding to the gaps, each of which is filled in the corresponding gap;
    removing the spacer to define a plurality of openings corresponding to each color filter unit to expose the drain of the corresponding TFT while forming the color filter layer;
    forming a plurality of pixel electrodes corresponding to the openings on the color filter layer and configuring the pixel electrodes to electrically connect to the drain of the TFT via the corresponding opening;
    wherein each of the color filter units simultaneously covers a source electrode, a path layer, and a partial drain electrode of the corresponding TFT.

2. The method of claim 1, wherein the photoresist layer is a positive photoresist.

3. The method of claim 1, wherein the color filter layer is a negative photoresist.

4. The method of claim 1, wherein the photoresist units comprises a plurality of red photoresist units, a plurality of green photoresist units, and a plurality of blue photoresist units, the red photoresist units, the green photoresist units, and the blue photoresist units are orderly alternately disposed in the gaps.

5. The method of claim 1, wherein the photoresist units comprises a plurality of red photoresist units, a plurality of green photoresist units, a plurality of blue photoresist units, and a plurality of white photoresist units; the red photoresist units, the green photoresist units, and the blue photoresist units, and the white photoresist units are orderly alternately disposed in the gaps.

6. The method of claim 1, wherein the color filter layer is also used as a deactivation layer of the TFT.

7. The method of claim 1, wherein after forming a color filter layer covered on the TFTs, the method further comprising:
    forming an insulating layer that simultaneously covers the pixel electrodes and the color filter layer.

8. The method of claim 1, wherein the spacer is substantially a trapezoidal shape, a width of the spacer away from the first substrate is wider than a width of the spacer adjacent to the first substrate.

9. The method of claim 8, wherein a width of the opening is in a range between 3-5 micrometers (mm), and a height of the opening is in a range between 5-10 mm.

10. A thin film transistor (TFT) array substrate comprising:
    a first substrate; and
    a plurality of TFTs formed on the first substrate;
    a photoresist layer covering the TFTs, wherein the photoresist layer is cut to form a plurality of spacers corresponding to the TFTs;
    a plurality of gaps are defined between two adjacent spacers;
    a color filter layer comprising different color of photoresist units in the gaps; the color filter layers comprise a plurality of color filter units; each of the color filter units covers a source electrode, a path layer, and a partial drain electrode of the corresponding TFT; and each of the color filter units defines an opening to expose a drain of the corresponding TFT via removing the spacers; a plurality of pixel electrodes corresponding to the openings are formed on the color filter layer, each pixel electrode is electrically connected to a drain of the TFT via the corresponding opening.

11. The TFT array substrate of claim 10, wherein the photoresist layer is a positive photoresist.

12. The TFT array substrate of claim 10, wherein the color filter layer is a negative photoresist.

13. The TFT array substrate of claim 10, wherein the photoresist units comprises a plurality of red photoresist units, a plurality of green photoresist units, and a plurality of blue photoresist units, the red photoresist units, the green photoresist units, and the blue photoresist units are orderly alternately disposed in the gaps.

14. The TFT array substrate of claim 10, wherein the photoresist units comprises a plurality of red photoresist units, a plurality of green photoresist units, a plurality of blue photoresist units, and a plurality of white photoresist units; the red photoresist units, the green photoresist units, and the blue photoresist units, and the white photoresist units are orderly alternately disposed in the gaps.

15. The method of claim 1, further comprising:
  forming an insulating layer covering the color filter layer and the pixel electrodes after the step of forming a color filter layer covering the TFTs.

16. The TFT array substrate of claim 10, wherein the TFT array substrate further comprises an insulating layer covering the color filter layer and the pixel electrodes.

\* \* \* \* \*